United States Patent
Adam et al.

(10) Patent No.: US 10,097,083 B2
(45) Date of Patent: Oct. 9, 2018

(54) FILTER ASSEMBLY, VOLTAGE CONVERTER HAVING A FILTER ASSEMBLY

(71) Applicant: Conti Temic microelectronic GmbH, Nuremberg (DE)

(72) Inventors: Karl-Heinz Adam, Eppenschlag (DE); Christoph Bloesch, Bubenreuth (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 0 days.

(21) Appl. No.: 15/534,252

(22) PCT Filed: Dec. 3, 2015

(86) PCT No.: PCT/EP2015/078442
§ 371 (c)(1),
(2) Date: Jun. 8, 2017

(87) PCT Pub. No.: WO2016/091700
PCT Pub. Date: Jun. 16, 2016

(65) Prior Publication Data
US 2017/0346391 A1    Nov. 30, 2017

(30) Foreign Application Priority Data
Dec. 10, 2014  (DE) .................. 10 2014 225 416

(51) Int. Cl.
*H01F 5/00*   (2006.01)
*H02M 1/44*   (2007.01)
(Continued)

(52) U.S. Cl.
CPC .............. *H02M 1/44* (2013.01); *G01R 15/18* (2013.01); *H01F 5/00* (2013.01); *H01F 17/06* (2013.01);
(Continued)

(58) Field of Classification Search
CPC ..................... H01F 5/00; H01F 27/00–27/36
(Continued)

(56) References Cited

U.S. PATENT DOCUMENTS 4,613,841 A * 9/1986 Roberts ................ H01F 17/043
336/160
5,099,756 A * 3/1992 Franconi ................ A61N 1/403
219/673
(Continued)

FOREIGN PATENT DOCUMENTS

CN    200986841 Y    12/2007   ............... H01F 1/10
CN    102368422 A    3/2012    ........... H01F 27/255
(Continued)

OTHER PUBLICATIONS

German Office Action, Application No. 102014225416.7, 6 pages, dated Sep. 8, 2015.
International Search Report and Written Opinion, Application No. PCT/EP2015/078442, 16 pages, dated Apr. 11, 2016.
(Continued)

*Primary Examiner* — Tuyen Nguyen
(74) *Attorney, Agent, or Firm* — Slayden Grubert Beard PLLC

(57) ABSTRACT

The present disclosure relates to filters. Teachings thereof may be embodied in a filter assembly, e.g., a filter assembly for filtering output currents from a voltage converter. For example, a filter assembly may include: a current conductor with a curved profile; a first ferrite body; a second ferrite body; and a recess with a curved profile defined in at least one of the first ferrite body and the second ferrite body. The first ferrite body and the second ferrite body may combine to surround the current conductor and the current conductor may extend along the recess.

8 Claims, 2 Drawing Sheets

(51) Int. Cl.
  *H01F 17/06*    (2006.01)
  *G01R 15/18*    (2006.01)
  *H01F 27/30*    (2006.01)
  *H02M 1/00*     (2006.01)

(52) U.S. Cl.
  CPC ....... *H01F 27/30* (2013.01); *H01F 2017/065* (2013.01); *H02M 2001/0064* (2013.01)

(58) Field of Classification Search
  USPC .............................. 336/65, 83, 192, 200, 232
  See application file for complete search history.

(56) References Cited

U.S. PATENT DOCUMENTS

| | | | |
|---|---|---|---|
| 5,910,030 A | 6/1999 | Hollander et al. | 439/620.05 |
| 2004/0008499 A1 | 1/2004 | Chiang | 361/797 |
| 2006/0022785 A1 | 2/2006 | Dobbs | 336/120 |
| 2010/0176909 A1 | 7/2010 | Yasuda et al. | 336/233 |
| 2014/0266558 A1 | 9/2014 | Catalano | 336/233 |

FOREIGN PATENT DOCUMENTS

| | | | | |
|---|---|---|---|---|
| JP | 2003188033 A | 7/2003 | ............ | H01F 37/00 |
| JP | 2004047769 A | 2/2004 | | |
| JP | 2011100807 A | 5/2011 | ............ | H01F 27/24 |
| WO | 2016/091700 A1 | 6/2016 | ............ | H01F 17/06 |

OTHER PUBLICATIONS

Chinese Office Action, Application No. 201580067268.X, 17 pages, dated Mar. 16, 2018.

\* cited by examiner

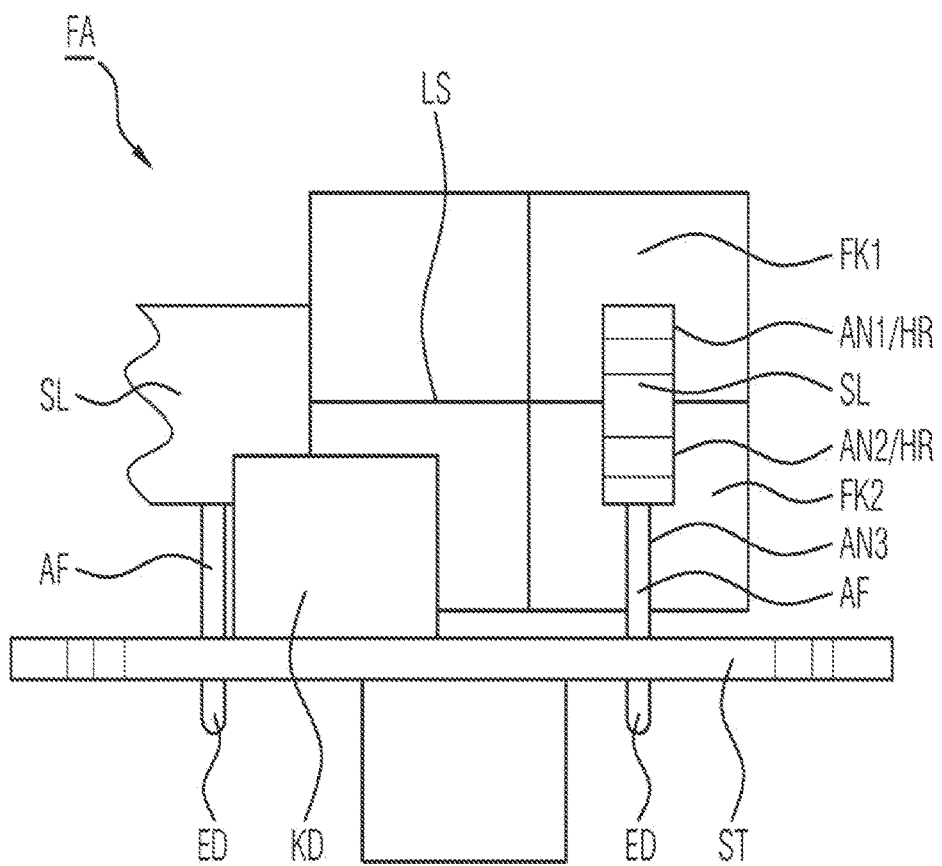

FILTER ASSEMBLY, VOLTAGE CONVERTER HAVING A FILTER ASSEMBLY

CROSS-REFERENCE TO RELATED APPLICATIONS

This application is a U.S. National Stage Application of International Application No. PCT/EP2015/078442 filed Dec. 3, 2015, which designates the United States of America, and claims priority to DE Application No. 10 2014 225 416.7 filed Dec. 10, 2014, the contents of which are hereby incorporated by reference in their entirety.

TECHNICAL FIELD

The present disclosure relates to filters. Teachings thereof may be embodied in a filter assembly, e.g., a filter assembly for filtering output currents from a voltage converter.

BACKGROUND

Voltage converters are often used in power-electronics fields, e.g., in on-board electrical systems of motor vehicles having two or more on-board electrical system branches, in which different voltage levels prevail and in which a voltage at one voltage level is converted in a unidirectional or bidirectional manner into a voltage at another voltage level. For design reasons, output currents from these voltage converters contain AC voltage components which can lead to functional faults in the electrical or electronic components which are connected downstream. Therefore, radio interference-suppression limit values are provided, e.g., in the automotive sector, for the output currents from voltage converters.

To avoid the functional faults due to fluctuating output currents from the voltage converters, the output currents from the voltage converters are filtered before they are passed on to the electrical or electronic components which are connected downstream. To this end, filter assemblies (e.g., EMC filters (electromagnetic compatibility)) are provided in the voltage converters, said filter assemblies weakening or filtering the AC voltage components in the output currents from the voltage converters.

SUMMARY

Some voltage converters are more compact and save more installation space while having the same or a better functionality. The teachings of the present disclosure may be embodied in a filter assembly that reduces the need for installation space while having the same or a better filter action.

For example, a filter assembly (FA) may comprise: a current conductor (SL) with a curved profile for conducting a current; a first ferrite body (FK1) and a second ferrite body (FK2); a recess (AN1, AN2) in the first ferrite body (FK1) and/or the second ferrite body (FK2) with a curved profile; wherein the first ferrite body (FK1) and the second ferrite body (FK2) jointly surround the current conductor (SL), and the current conductor (SL) extends along the recess (AN1, AN2).

In some embodiments, the recess (AN1, AN2) and the current conductor (SL) are matched to one another in terms of their respective profiles and also in terms of their respective cross sections in such a way that the current conductor (SL) fits into a hollow space (HR), which is formed by the recess (AN1, AN2) of the first ferrite body (FK1) and/or the second ferrite body (FK2), between the first ferrite body (FK1) and the second ferrite body (FK2).

In some embodiments, the first ferrite body (FK1) and the second ferrite body (FK2) together have a center line which corresponds substantially to a center line (ML) of the current conductor (SL) which extends in the direction of extent (ER) of the current conductor (SL).

In some embodiments, there is an air gap (LS) between the first ferrite body (FK1) and the second ferrite body (FK2), which air gap extends substantially in the direction of extent (ER) of the current conductor (SL). In some embodiments, the one air gap (SL) extends substantially parallel to the center line (ML).

In some embodiments, the first ferrite body (FK1) and/or the second ferrite body (FK2) are each integrally formed.

In some embodiments, the current conductor (SL) has at least one integrally formed portion (AF) which extends away from the center line (ML) and has an exposed end (ED), and the first ferrite body (FK1) and/or the second ferrite body (FK2) have/has at least one further recess (AN3) through which the at least one integrally formed portion (AF) extends, wherein the exposed end (ED) forms an electrical contact to the current conductor (SL).

As another example, a voltage converter, in particular for an on-board electrical system of a vehicle, may comprise a voltage converter circuit for providing output currents and a filter assembly (FA) as described above for filtering the output currents which are provided by the voltage converter circuit, wherein the current conductor (SL) of the filter assembly (FA) is electrically conductively connected to an output of the voltage converter circuit.

BRIEF DESCRIPTION OF THE DRAWINGS

An exemplary embodiment of the invention is described in more detail below with reference to the appended drawing, in which:

FIG. 2 is a schematic illustration of a side view of a section of the filter assembly illustrated in FIG. 1.

DETAILED DESCRIPTION

Figure 1:
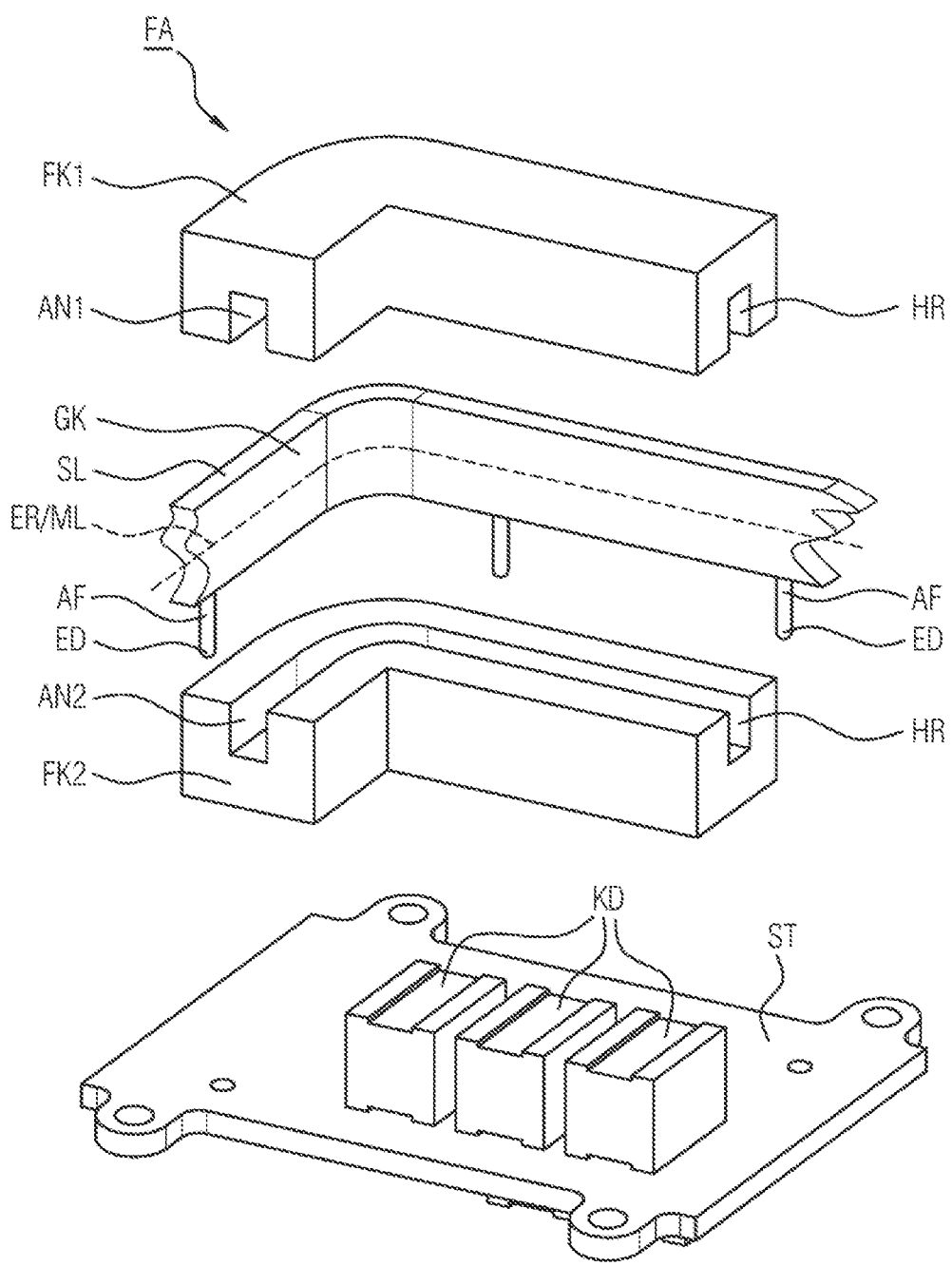
FIG. 1 is a schematic exploded illustration of a section of a filter assembly according to one embodiment of the invention.

The teachings of the present disclosure may be embodied in a filter assembly. For example, a filter assembly may comprise a current conductor which has a curved (bent or kinked) profile and is designed for conducting a current (for example an output current from a voltage converter). In some embodiments, the filter assembly also comprises a first ferrite body and a second ferrite body which each have a curved profile and jointly (substantially) surround the current conductor. In this case, the first ferrite body and/or the second ferrite body have at least one recess which likewise has a curved profile and extends along the current conductor. The profile of the ferrite bodies, in particular the profile of the recess in said ferrite bodies, may correspond to the profile of the current conductor. A curved design of the current conductor allows a flexible design, which is matched to the available installation space, of the current conductor and also of the two ferrite bodies and therefore a construction of the filter assembly such that installation space is saved while having the same total inductance of the filter assembly and therefore the same filter action, or a higher total inductance and therefore a better filter action with the same installation space of the filter assembly.

The first ferrite body and/or the second ferrite body each form one of two ferrite core halves which, owing to their curved profiles, can jointly surround the current conductor in spite of its curved profile. This allows, in particular, the current conductor to be continuously surrounded in a manner extending over the curved extent of the current conductor by a single ferrite core (which consists of two ferrite core halves), said surrounding allowing a higher total inductance overall for the filter assembly and therefore a better filter action in comparison to a current conductor being surrounded in sections by a plurality of ferrite cores which are physically separate from one another. In this case, the term "jointly surround" means that the two ferrite bodies jointly form the same ferrite core (which surrounds the current conductor) and jointly surround substantially the same section of the current conductor. The surrounding runs around the current conductor in the circumferential direction.

The curved profiles of the two ferrite bodies additionally allow the entire, exposed installation space in the filter assembly around the current conductor to be filled with the ferrite material, as a result of which the cross-sectional area of the ferrite core through which the magnetic field flows is considerably increased. A relatively high total inductance for the filter assembly is achieved in the filter assembly with the same installation space as a result. In addition, the saturation behavior of the filter assembly can be managed substantially better. This allows the filter assembly to be shaped such that more installation space is saved while having the same or even a better filter action.

Therefore, a high total inductance for high useful currents (which are to be filtered) can be realized with the above-described filter assembly. Filter assemblies of this kind can therefore be used, in particular, in electrical systems, such as in an on-board electrical system of a hybrid electric vehicle or electric vehicle, where high power densities prevail but only small installation spaces are available.

The recess and the current conductor may be matched to one another in terms of their respective profiles and also in terms of their respective cross sections in such a way that the current conductor fits substantially into a hollow space, which is formed by the recess, between the first ferrite body and the second ferrite body. The recess and the current conductor may have substantially the same curved profile or the same curved shape, which curved profile or curved shape substantially allows the current conductor to be arranged in the recess with an accurate fit and allows the current conductor to be surrounded by the two ferrite bodies with an accurate fit.

The recess may substantially form a groove-like design. The groove can have, for example, a rectangular, trapezoidal or semicircular cross section.

The first ferrite body and the second ferrite body together (therefore the ferrite core) may have a center line which corresponds substantially to a center line of the current conductor which extends in the direction of extent of the current conductor. In this case, the center line of the first ferrite body and of the second ferrite body or of the ferrite core is a collection of all of the centroids of the cross sections of the two ferrite bodies or of the ferrite core which comprises these two ferrite bodies.

In some embodiments, the first ferrite body and the second ferrite body may be of symmetrical design around their common center line which likewise extends in the direction of extent of the current conductor. The center line corresponds, in particular, to the area centroids of the ferrite bodies (jointly).

The two ferrite bodies and the current conductor may have the same curved profile or the same curved shape, which curved profile or curved shape allows cross sections which are symmetrical along the elongate direction of extent of the current conductor.

The filter assembly may comprise a first current connection and a second current connection, wherein the current conductor extends from the first current connection to the second current connection and electrically connects the first current connection and the second current connection to one another. The first ferrite body and the second ferrite body may likewise extend substantially from the first current connection to the second current connection.

The filter assembly may have at least one air gap between the first ferrite body and the second ferrite body, which air gap extends substantially in the direction of extent of the current conductor. In some embodiments, the at least one air gap extends substantially parallel to the center line.

Owing to the at least one air gap, an open magnetic circuit is formed around the current conductor, as a result of which, in turn, the saturation behavior of the two ferrite bodies (of the ferrite core) or of the filter assembly is weakened and therefore improved. The saturation behavior can be adjusted as desired by correspondingly changing the shape and the size of the at least one air gap, such as the gap width for example.

In some embodiments, the first ferrite body and/or the second ferrite body are each integrally formed. In some embodiments, the current conductor has at least one integrally formed portion which extends away from the center line and, for its part, has an exposed end for establishing electrical contact to the current conductor. In some embodiments, the first ferrite body and/or the second ferrite body have/has at least one further recess through which the at least one integrally formed portion extends.

The integrally formed portions can serve, in particular, as current taps for discharge capacitors. A filter assembly with adjustable partial inductances, which can be adjusted in accordance with the application by forming corresponding electrical contacts to the selected integrally formed portions, can be provided by varying the number of integrally formed portions and points on the two ferrite bodies where said integrally formed portions are integrally formed.

Some embodiments may include a voltage converter. In some embodiments, the voltage converter comprises a voltage converter circuit for providing output currents and an above-described filter assembly for filtering the output currents from the voltage converter circuit, wherein the current conductor of the filter assembly is electrically conductively connected to a positive output connection of the voltage converter circuit.

FIG. 1 shows a schematic exploded illustration of a section of a filter assembly FA for a DC/DC converter, not illustrated in the figure. The filter assembly FA is electrically connected between a positive output connection of a voltage converter circuit, not illustrated in the figure, of the DC/DC converter and an output connection of the DC/DC converter and is designed to filter AC voltage components in the output currents which are provided by the voltage converter circuit and to pass on the filtered output currents to the output connection of the DC/DC converter.

The filter assembly FA comprises a current conductor SL (only a section of the current conductor SL is illustrated in the figure) to conduct output currents from the voltage converter circuit to the output connection of the DC/DC converter and, in the process, to filter the AC voltage components in the output currents.

The current conductor SL comprises a main body GK which is substantially composed of a punched strip of a copper alloy and, to reduce the installation space of the filter assembly, is designed such that it is curved in an L shape or extends along an L-shaped center line ML. The current conductor SL further comprises three rod-like integrally formed portions AF which are composed of the same copper alloy and extend laterally from the main body GK of the current conductor SL and perpendicular to the center line ML. In some embodiments, the three integrally formed portions AF are punched at the same time as the current conductor SL is punched out and are therefore integrally formed with the main body GK. The integrally formed portions AF serve to establish electrical contacts from the current conductor SL to discharge capacitors KD, which will be described below, and each have an exposed end ED for forming said electrical contacts.

The filter assembly FA further comprises a first ferrite body FK1 and a second ferrite body FK2, wherein the two ferrite bodies FK1, FK2 are of symmetrical design in relation to one another substantially around the center line ML of the current conductor SL.

The two ferrite bodies FK1, FK2 each have a groove-like recess AN1, AN2 on respective surfaces which face the current conductor SL, said groove-like recesses being of symmetrical design in relation to one another around the center line ML of the current conductor SL.

The shapes and cross sections of the current conductor SL and of the two recesses AN1, AN2 are matched to one another in such a way that the two recesses AN1, AN2 form a hollow space HR which can just accommodate the current conductor SL and which is also just filled by the current conductor SL. The two ferrite bodies FK1, FK2 therefore jointly form a single ferrite core which virtually completely surrounds the current conductor SL in its direction of extent ER.

In some embodiments, the filter assembly FA further comprises a circuit carrier ST for mechanically fastening the current conductor SL and the two ferrite bodies FK1, FK2. The filter assembly FA also comprises three above-mentioned discharge capacitors KD which are arranged and mechanically fastened on the circuit carrier ST. The three discharge capacitors KD are each electrically connected to one of the three integrally formed portions AF and form a low-pass filter with n topology with the current conductor SL and the two ferrite bodies FK1, FK2.

FIG. 2 is a schematic illustration of the side of the filter assembly FA illustrated in FIG. 1 (or a section of the filter assembly FA) in an assembled state.

In the assembled state, the two ferrite bodies FK1, FK2 completely surround the current conductor SL, apart from an air gap LS, in its circumferential direction. The air gap LS extends substantially parallel to the center line ML of the current conductor SL. The air gap LS improves the saturation behavior of the filter assembly FA and therefore allows a relatively high useful current to be filtered.

In this case, the integrally formed portions AF on the current conductor SL protrude through corresponding recesses AN3 on the second ferrite body FK2 out of the hollow space HR and are fastened to the circuit carrier ST by means of the exposed ends ED and are electrically conductively connected to conductor tracks on the circuit carrier ST, which conductor tracks lead to the respective corresponding discharge capacitors KD and are electrically connected to corresponding current connections of the discharge capacitors KD.

The curved shapes of the current conductor SL and of the two ferrite bodies FK1, FK2 allow a construction of the filter assembly FA such that installation space is saved. The designs, which are matched in terms of shape and cross section, of the current conductor SL and of the two recesses AN1, AN2 on the two ferrite bodies FK1, FK2 allow an integral ferrite core to be formed, which integral ferrite core can completely surround the current conductor SL over virtually the entire extent of the current conductor SL in spite of the curved shape of said current conductor. This allows a relatively high total inductance of the filter assembly FA.

What is claimed is:

1. A filter assembly comprising:
    a current conductor with a curved profile for conducting a current, the current conductor including one or more integrally formed protrusions;
    a first ferrite body;
    a second ferrite body; and
    a recess with a curved profile defined in at least one of the first ferrite body and the second ferrite body;
    wherein the first ferrite body and the second ferrite body combine to surround the current conductor;
    the current conductor extends along the recess;
    and the one or more integrally formed protrusions from the current conductor protrude through corresponding recesses in one of the two ferrite bodies to provide respective electrically conductive connection points to the current conductor.

2. The filter assembly as claimed in claim 1, wherein the recess and the current conductor are matched to one another in terms of their respective profiles and respective cross sections; and
    the current conductor fits into a hollow space defined by the recess between the first ferrite body and the second ferrite body.

3. The filter assembly as claimed in claim 1, wherein the first ferrite body and the second ferrite body together define a center line corresponding substantially to a center line of the current conductor.

4. The filter assembly as claimed in claim 1, further comprising an air gap between the first ferrite body and the second ferrite body, the air gap extending substantially along a primary dimension of the current conductor.

5. The filter assembly as claimed in claim 4, wherein the air gap extends substantially parallel to the center line of the current conductor.

6. The filter assembly as claimed in claim 1, wherein the first ferrite body and the second ferrite body are each integrally formed.

7. The filter assembly as claimed in claim 1, wherein:
    the current conductor includes at least one integrally formed portion extending away from the center line and an exposed end; and
    the first ferrite body and the second ferrite body define a second recess through which the at least one integrally formed portion extends;
    wherein the exposed end forms an electrical contact to the current conductor.

8. A voltage converter comprising:
    a voltage converter circuit for providing output currents;
    a current conductor with a curved profile for conducting a current, the current conductor including one or more integrally formed protrusions;
    a first ferrite body;
    a second ferrite body; and a recess with a curved profile defined in at least one of the first ferrite body and the second ferrite body;

wherein the first ferrite body and the second ferrite body combine to surround the current conductor; and the current conductor extends along the recess;

the current conductor filtering output currents provided by the voltage converter circuit;

the one or more integrally formed protrusions from the current conductor protrude through corresponding recesses in one of the two ferrite bodies to provide respective electrically conductive connection points to the current conductor;

wherein the current conductor of the filter assembly is conductively connected through the one or more integrally formed protrusions to an output of the voltage converter circuit.

\* \* \* \* \*